United States Patent [19]
Lam

[11] Patent Number: 5,203,074
[45] Date of Patent: Apr. 20, 1993

[54] SIMM EXTRACTION TOOL

[75] Inventor: Alan W. Lam, Fremont, Calif.

[73] Assignee: Sun Microsystems, Inc., Mountain View, Calif.

[21] Appl. No.: 813,347

[22] Filed: Dec. 24, 1991

[51] Int. Cl.⁵ ............................................. H05K 13/04
[52] U.S. Cl. ......................................... 29/829; 29/267; 29/426.5; 29/764
[58] Field of Search .................. 29/764, 267, 426.5, 29/758, 829

[56] References Cited

U.S. PATENT DOCUMENTS

| | | | |
|---|---|---|---|
| 1,302,595 | 5/1919 | Russell | 29/267 |
| 3,626,575 | 12/1971 | Greenspan | 29/764 |
| 4,519,130 | 5/1985 | Schaeter | 29/764 |

*Primary Examiner*—Carl E. Hall
*Attorney, Agent, or Firm*—Blakely Sokoloff Taylor & Zafman

[57] ABSTRACT

An extraction tool that provides for easy removal of a SIMM from a connector while preventing damage to the SIMM and the connector. The extraction tool is composed primarily of a handle portion and two arms. Each arm has a pin that couples to the holdes in a SIMM. Each arm is further comprised of an elbow portion to allow for pivoting motion of the extraction tool in order to pry a SIMM from its connector. Contact edges are provided on each arm to aid in positioning the extraction tool upon the upper edge of a connector. Each arm of the extraction tool has a chamfer surface to provide for proper coupling of a SIMM connector and to the holes in the ends of a SIMM while the SIMM is installed.

18 Claims, 3 Drawing Sheets

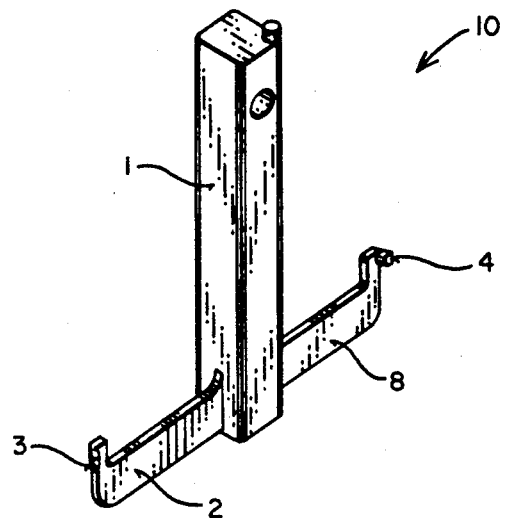
FIG_1
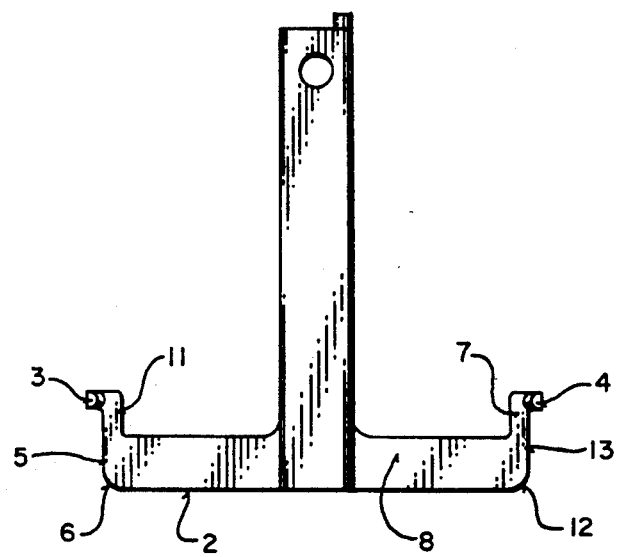
FIG_2
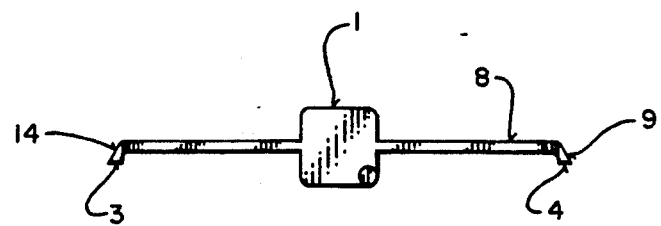
FIG_3

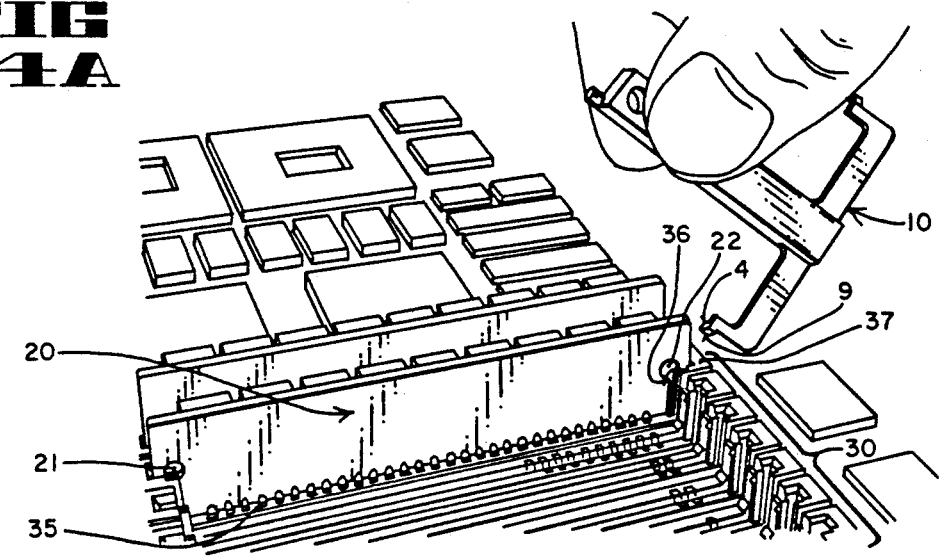
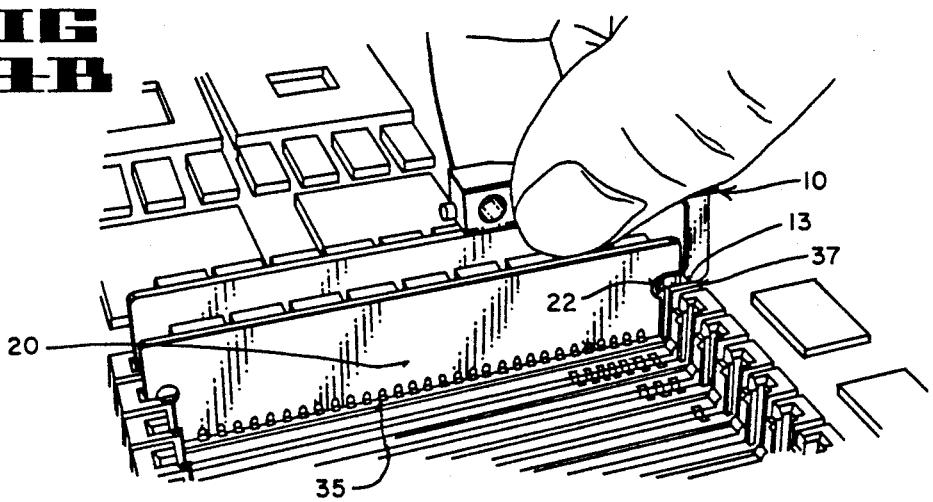
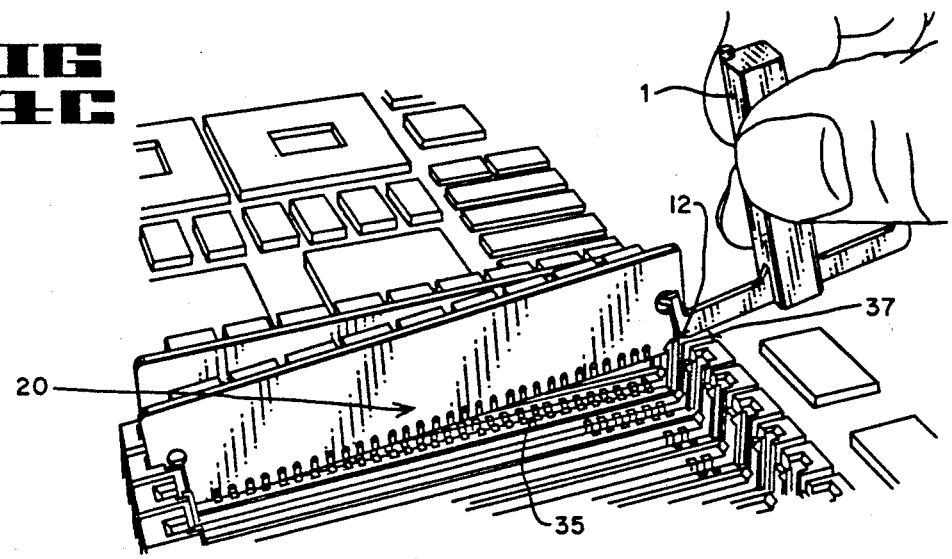

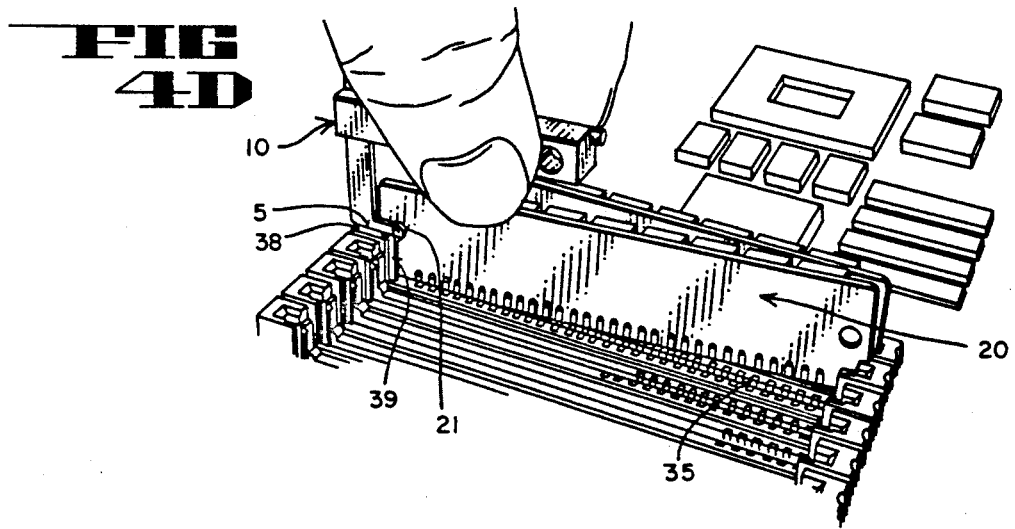
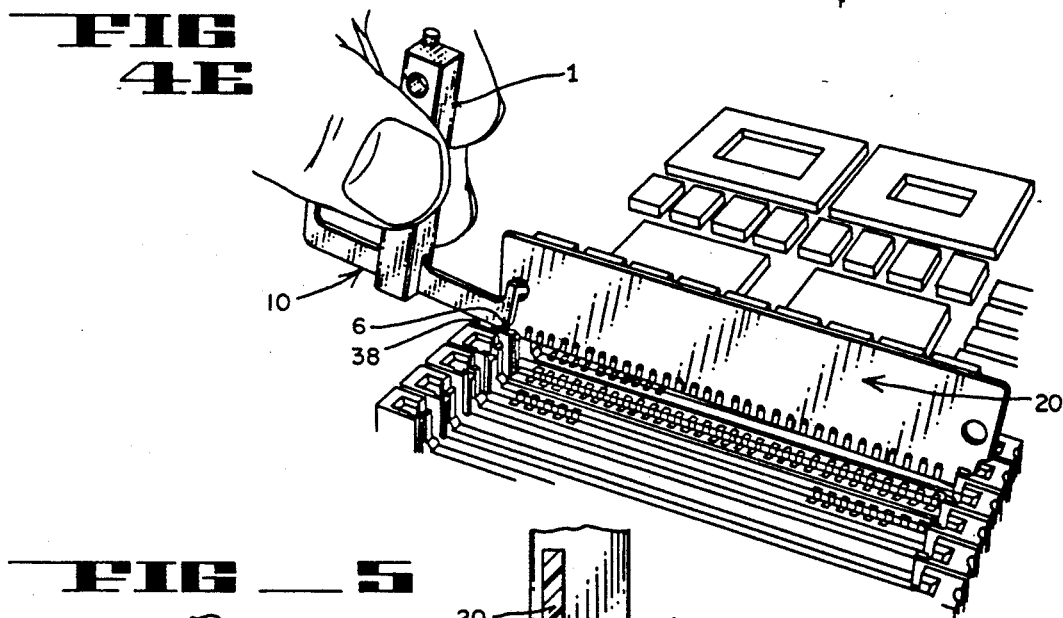
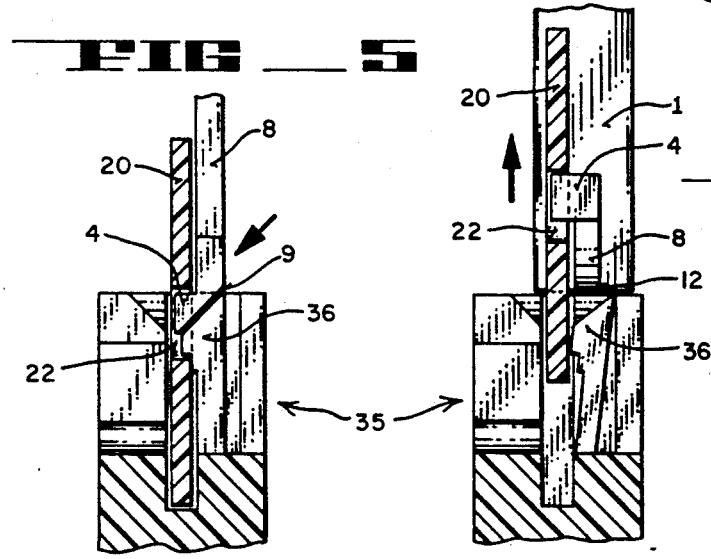
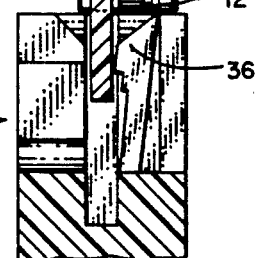

SIMM EXTRACTION TOOL

BACKGROUND OF THE INVENTION

1. Field of the Invention

This invention relates to modular circuit board designs for computer systems. More particularly, this invention relates to tools used to remove modular circuit boards.

2. Art Background

In recent years there has been a move towards compact design of computer systems. Toward this end, manufacturer's often employ single in-line memory modules, also known as SIMMs. SIMMs are small modular circuit boards that typically contain memory. SIMMs are usually connected to a main circuit board of a computer system through multi-pin edge connectors which reside on the main circuit board. One edge of a SIMM is inserted into an edge connector so that the SIMM is positioned perpendicular to the main circuit board. With this arrangement, a number of SIMMs can be closely positioned parallel to each other and perpendicular to the main circuit board. Such an arrangement provides a dense coupling of memory modules to the main circuit board while conserving space on the main circuit board.

However, the advantages of close spacing and compact design provided by the use of SIMMs causes difficulties in removing them from their connectors during field service. SIMMs have a hole positioned near each end in accordance with a published specification. In the past, a typical method of removing a SIMM was to insert a small screw driver into one of the holes and pry up on the edge of the hole against the top of the connector. However, this method is likely to damage both the module and the connector. Moreover, because SIMMs are usually closely spaced, it is difficult to get a small screw driver into one of the holes.

An alternative method of removing SIMMs is to use a pair of pliers to grip an edge of the SIMM in order to pull the SIMM out of its connector. However, this method can easily damage the circuit traces or components mounted on the SIMM. It is not uncommon for field service personnel to try pulling SIMMs out using their fingers only. However, the insertion force of the connector often makes this method difficult, if not impossible.

As will be described, the present invention provides a SIMM extraction tool that allows easy removal of closely spaced SIMMs while not damaging the SIMMs, the connectors, the computer system, or the field service person.

SUMMARY OF THE INVENTION

An extraction tool is disclosed that provides for easy removal of a SIMM from a connector while preventing damage to the SIMM and the connector. The extraction tool is composed primarily of a handle portion and two prependicularly extending arms. Each arm has a pin that couples to the holes in a SIMM. Each arm is further comprised of an elbow portion to allow for pivoting motion of the extraction tool in order to pry a SIMM from its connector. Contact edges are provided on each arm to aid in positioning the extraction tool upon the upper edge of a connector. Each arm of the extraction tool has a chamfer surface to provide for proper positioning of the extraction tool against a SIMM connector, and coupling of the pins on the extraction toll arms to the holes in the ends of a SIMM while the SIMM is installed.

BRIEF DESCRIPTION OF DRAWINGS

FIG. 1 provides a perspective view of the SIMM extraction tool.

FIG. 2 provides a front view of the SIMM extraction tool.

FIG. 3 is a top view of the SIMM extraction tool.

FIGS. 4a-4e illustrate the operation of the SIMM extraction tool to remove a SIMM from an edge connector.

FIG. 5 provides a cut away view of the SIMM extraction tool coupled to a hole in a SIMM module.

FIG. 6 provides a cut away view of a SIMM being pried out of its connector using the SIMM extraction tool.

DETAILED DESCRIPTION OF THE INVENTION

An extraction tool is disclosed that provides for easy removal of a SIMM from a connector while preventing damage to the SIMM and the connector. In the following description for purposes of explanation, numerous details are set forth such as specific components, connectors, etc., in order to provide a thorough understanding of the present invention. However, it will be apparent to one skilled in the art that these specific details are not required to practice the present invention. In other instances well known structures are shown in order not to obscure the present invention unnecessarily.

FIG. 1 provides a perspective view of the extraction tool of the presently preferred embodiment. Extraction tool 10 is composed primarily of handle portion 1, arm 2, and arm 8. Pin 3 is positioned on arm 2, while pin 4 is positioned on arm 8. Pin 3 and pin 4 are used to couple to the holes in a SIMM in order to remove it from a connector. FIG. 2 provides a front view of extraction tool 10. Elbow 6 and elbow 12 allow for pivoting motion of extraction tool 10 in order to pry a SIMM from its connector. Contact edge 5 and contact edge 13 aid in positioning extraction tool 10 on the upper edge of a connector. Pin support 7 and pin support 11 provide for proper positioning of pin 3 and pin 4 in order to couple to the holes in a SIMM. FIG. 3 provides a top view of extraction tool 10 showing chamfer surface 9 and chamfer surface 14. Chamfer surface 9 and chamfer surface 14 provide for proper coupling of extraction tool 10 to a SIMM connector and to the holes in the ends of a SIMM while the SIMM is installed.

FIGS. 4a-4e provide an illustration of extraction tool 10 in operation to remove a SIMM from a its connector. FIG. 4a shows SIMM 20 coupled to SIMM connector 35. SIMM connector 35 is part of SIMM connector row 30. SIMM 20 has a pair of holes, hole 21 and hole 22, which are located near the ends of SIMM 20 in accordance with a published specification. Each end of SIMM connector 35 has a tang to hole the SIMM in place and prevent vertical movement. For example, tang 36 couples to hole 22 in order to hold SIMM 20 in place. FIG. 4a also shows extraction tool 10, including chamfer surface 9 which will contact tang 36, and pin 4 which will couple to hole 22. Chamfer surface 9 provides the proper angled surface to allow extraction tool 10 to be inserted into hole 22. The angled top portion of tang 36 has substantially the same angle as chamfer surface 9.

FIG. 4b illustrates the initial coupling of extraction tool 10 to SIMM 20 to begin removal of SIMM 20. Pin 3 is shown inserted into hole 22 and contact edge 13 is shown in contact with the upper edge 37 of SIMM connector 35. FIG. 4c illustrates one end of SIMM 20 being removed from SIMM connector 35. The operator grips handle portion 1 of extraction tool 10 using thumb and forefingers and pulls back rotating extraction tool 10 around elbow 12. Elbow 12 pivots on the upper edge 37 of edge connector 35.

FIG. 4d illustrates the positioning of extraction tool 10 to remove the remaining end of SIMM 20. Contact edge 5 is shown in contact with upper edge 38 of SIMM connector 35. Pin 3 is shown coupled into hole 21. Chamfer surface 14 is shown in contact with tang 39 of SIMM connector 35. FIG. 4e illustrates the removal of the remaining end of SIMM 20 using extraction tool 10. Extraction tool 10 pivots on elbow 6 while making contact with upper edge 38 of SIMM connector 35. The operator pulls back on handle portion 1 in order to pivot extraction tool 10 around elbow 6 and remove the remaining end of SIMM 20 from SIMM connector 35.

FIG. 5 provides a cut away view of extraction tool 10 positioned to remove the end of SIMM 20 having hole 22 from SIMM connector 35. Pin 4 is shown inserted into hole 22 with chamfer surface 9 shown in contact with tang 36. Also shown in arm 8, with the handle portion of extraction tool 10 not visible. FIG. 6 provides a cut away view of SIMM 20 being pried out of SIMM connector 35 by extraction tool 10. Tang 36 is shown decoupled from hole 22 with SIMM 20 raised vertically. Handle portion 1 is visible as extraction tool 10 pivots around elbow 12.

While this invention has been described in conjunction with the current embodiment illustrated in FIGS. 1 through 6, it is evident that numerous alternatives, modifications, variations and uses will be apparent to those skilled in the art in light of the foregoing description.

What is claimed is:

1. An extraction tool for removing a single in-line memory module (SIMM) from a connector, said SIMM having a pair of vertical edges and a pair of holes, one of said holes offset from each of said vertical edges in accordance with a published specification for said SIMM, comprising:
   an elongated handle member having a first end and a second end;
   an L-shaped first arm for coupling to said holes and removing said SIMM from said connector, said first arm comprising;
   an elongated first portion coupled to said first end of said handle member and projecting perpendicularly from said handle member; and
   a second portion projecting perpendicularly from said first portion toward said second end of said handle member such that said first portion is parallel to said handle member, said second portion of said first arm having a length substantially equal the distance each of said holes in said SIMM are offset from said vertical edges of said SIMM;
   said extraction tool further comprising an L-shaped second arm for coupling to said holes and removing said SIMM from said connector.

2. The extraction tool defined by claim 1 wherein said first arm further comprises first grip means for coupling to said holes in said SIMM, said first grip means located at an extreme portion of said second portion of said first arm.

3. The extraction tool defined by claim 1 wherein said second arm comprises:
   an elongated first portion coupled to said first end of said handle member and projecting perpendicularly from said handle member in a direction opposite to said first arm;
   a second portion projecting perpendicularly from said first portion toward said second end of said handle member such that said second portion is parallel to said handle member, said second portion of said second arm having a length substantially equal the distance each of said holes in said SIMM are offset from said vertical edges of said SIMM.

4. The extraction tool defined by claim 3 wherein said second arm further comprises second grip means for coupling to said holes in said SIMM, said second grip means located at an extreme portion of said second portion of said second arm.

5. The extraction tool defined by claim 2 wherein said first grip means comprises a first pin projecting from said second portion of said first arm, such that said first pin projects perpendicularly to said first and second portions of said first arm.

6. The extraction tool defined by claim 5 wherein said first grip means further comprises a first chamfer edge of said first pin for enabling said first pin to be cooperatively positioned adjacent to said connector and engage said holes in said SIMM.

7. The extraction tool defined by claim 4 wherein said second grip means comprises a second pin projecting from said second portion of said second arm, such that said second pin projects perpendicularly to said first and second portions of said second arm.

8. The extraction tool defined by claim 7 wherein said second grip means further comprises a second chamfer edge of said second pin for enabling said second pin to be cooperatively positioned adjacent to said connector and engage said holes in said SIMM.

9. An extraction tool for removing a single in-line memory module (SIMM) from a connector, said SIMM having a pair of vertical edges and a pair of holes, one of said holes offset from each of said vertical edges in accordance with a published specification for said SIMM, comprising:
   an elongated handle member having a first end and a second end;
   a pair of horizontally opposed arms for coupling to said holes and removing said SIMM from said connector, said arms comprising;
   an elongated first portion coupled to said first end of said handle member and projecting perpendicular from said handle member; and
   a second portion projecting at a right angle from said first portion in the direction of said second end of said handle member such that said first portion is parallel to said handle member, said second portion of said arm having a length substantially equal the distance each of said holes in said SIMM are offset from said vertical edges of said SIMM.

10. The extraction tool defined by claim 9 wherein each of said arms further comprises grip means for coupling to said holes in said SIMM, said grip means located at an extreme portion of said second portion of said arms.

11. The extraction tool defined by claim 9 wherein said grip means comprises a pin projecting from said second portion of said arms, such that said pin projects perpendicular to said first and second portions of said arms.

12. The extraction tool defined by claim 11 wherein said grip means further comprises a chamfer edge of said pin for enabling said pin to slide into said connector and couple with said holes in said SIMM.

13. The extraction tool defined by claim 11 wherein said pins of both of said arms project from said arms in the same direction perpendicular to said arms and said handle member.

14. A method for removing a single in-line memory module (SIMM) from a connector, said SIMM having a first vertical edge and a second vertical edge and a first hole and a second hole, said first hole offset from said first vertical edge and said second hole offset from said second vertical edge in accordance with a published specification for said SIMM, comprising the steps of:

providing an extraction tool comprised of an elongated handle member having a first end and a second end and a first arm and a horizontally opposed second arm for coupling to said holes, said first and second arms coupled to said first end of said handle member;

coupling said first arm to said first hole;

applying force to said second end of said handle such that said first arm causes vertical movement of said first vertical edge while said second vertical edge remains coupled to said connector;

coupling said second arm to said second hole;

applying force to said second end of said handle such that said second arm causes vertical movement of said second vertical edge.

15. The method defined by claim 14 wherein said first and second arms each comprise:

an elongated first portion coupled to said first end of said handle member and projecting perpendicular from said handle member;

a second portion projecting at a right angle from said first portion in the direction of said second end of said handle member such that said first portion is parallel to said handle member, said second portion of said arm having a length substantially equal the distance said first and second holes in said SIMM are offset from said first and second vertical edges of said SIMM.

16. The method defined by claim 15 wherein said steps of coupling said first arm to said first hole and coupling said second arm to said second hole further comprise the step of providing grip means for coupling to said first and second holes, said grip means located at an extreme portion of said second portion of said first and second arms.

17. The method defined by claim 16 wherein said grip means comprises a pin projecting from said second portion of said arms, such that said pin projects perpendicular to said first and second portions of said arms.

18. The method defined by claim 17 wherein said steps of coupling said first arm to said first hole and coupling said second arm to said second hole further comprise the step of inserting said pins into said first and second holes.

* * * * *